United States Patent
Iwashita et al.

(10) Patent No.: US 8,404,406 B2
(45) Date of Patent: Mar. 26, 2013

(54) PHOTOMASK BLANK AND METHOD FOR MANUFACTURING THE SAME

(75) Inventors: Hiroyuki Iwashita, Tokyo (JP); Hiroaki Shishido, Tokyo (JP); Atsushi Kominato, Tokyo (JP); Masahiro Hashimoto, Tokyo (JP)

(73) Assignee: Hoya Corporation, Tokyo (JP)

( * ) Notice: Subject to any disclaimer, the term of this patent is extended or adjusted under 35 U.S.C. 154(b) by 153 days.

(21) Appl. No.: 12/935,519

(22) PCT Filed: Mar. 31, 2009

(86) PCT No.: PCT/JP2009/056603
§ 371 (c)(1),
(2), (4) Date: Dec. 2, 2010

(87) PCT Pub. No.: WO2009/123166
PCT Pub. Date: Oct. 8, 2009

(65) Prior Publication Data
US 2011/0081605 A1  Apr. 7, 2011

(30) Foreign Application Priority Data
Mar. 31, 2008 (JP) ................................. 2008-090249

(51) Int. Cl.
*G03F 1/22* (2012.01)
(52) U.S. Cl. .......................................... 430/5
(58) Field of Classification Search . 430/5; 204/192.15, 204/192.22, 192.23; 428/428, 430
See application file for complete search history.

(56) References Cited

U.S. PATENT DOCUMENTS

| 5,844,578 A | 12/1998 | Mochizuki et al. |
| 6,335,124 B1 * | 1/2002 | Mitsui et al. ...................... 430/5 |
| 7,575,798 B2 * | 8/2009 | Bellman et al. ............... 428/138 |
| 2002/0061452 A1 | 5/2002 | Nozawa et al. |
| 2002/0068228 A1 | 6/2002 | Kureishi et al. |
| 2006/0088773 A1 | 4/2006 | Bellman et al. |

FOREIGN PATENT DOCUMENTS

| JP | 6-89021 A | 3/1994 |
| JP | 8-286359 A | 11/1996 |
| JP | 2002-169265 A | 6/2002 |
| JP | 2003-248298 A | 9/2003 |
| JP | 2004-318184 A | 11/2004 |
| JP | 2005156700 A | 6/2005 |
| WO | 2006/047314 A2 | 5/2006 |

OTHER PUBLICATIONS

Japanese Office Action corresponding to Japanese Patent Application No. 2010-505922, dated Dec. 13, 2012.

* cited by examiner

*Primary Examiner* — Stephen Rosasco
(74) *Attorney, Agent, or Firm* — Sughrue Mion, PLLC (57) ABSTRACT

The present invention provides a photomask blank in which a light-shielding film consisting of a plurality of layers is provided on a light transmissive substrate, wherein a layer that is provided to be closest to the front surface is made of CrO, CrON, CrN, CrOC or CrOCN, and wherein the atom number density of the front-surface portion of the light-shielding film is $9 \times 10^{22}$ to $14 \times 10^{22}$ atms/cm$^3$.

19 Claims, 1 Drawing Sheet

PHOTOMASK BLANK AND METHOD FOR MANUFACTURING THE SAME

TECHNICAL FIELD

The present invention relates to a photomask blank, a photomask and a method for manufacturing a photomask blank.

BACKGROUND ART

In general, in the production processes of high-density semiconductor integrated circuits such as LSI, color filters for CCD (charge-coupled device) and LCD (liquid crystal display device), magnetic heads, etc., microfabrication utilizing the photolithographic technique using photomasks is performed.

In this microfabrication, a photomask, in which a light-shielding film made of a metal thin film such as a chromium film is generally formed on a light transmissive substrate made of quartz glass, aluminosilicate glass or the like by means of sputtering, vacuum deposition or the like to provide a photomask blank, wherein the light-shielding film is formed to have a predetermined pattern, is used.

A photomask is produced using such a photomask blank with the following processes: an exposure process in which a desired pattern exposure is applied to a resist film formed on the photomask blank; a development process in which, after the desired pattern exposure is applied to the resist film formed on the photomask blank, a developing solution is supplied thereto to dissolve portions of the resist film soluble in the developing solution, thereby forming a resist pattern; a etching process in which, using the obtained resist pattern as a mask, portions in which a light-shielding film is exposed with the resist pattern not formed are removed by etching, such as, wet etching using an etching solution consisting of a mixed aqueous solution of ceric ammonium nitrate and perchloric acid, and dry etching using chlorine gas, thereby forming a predetermined mask pattern on a light transmissive substrate; and a stripping/removing process in which the remaining resist pattern is stripped and removed.

In general, such a light-shielding film made of a chromium film or the like has a high optical reflectance, and a phenomenon, in which light reflected by a semiconductor substrate that is an exposed product passes through a projector lens and is reflected by a photomask to return to the semiconductor substrate, occurs. As a result, an undesired portion is irradiated with an exposure light. In order to prevent such a phenomenon, usually, an antireflection layer is formed on the surface of a light-shielding film of a photomask blank.

A photomask is washed at the time of production or use thereof. At the time of such washing, an acid such as sulfuric acid is often used (for example, see Japanese Laid-Open Patent Publication No. 2003-248298 (Patent Document 1)). However, when the photomask is washed with sulfuric acid, sulfuric acid or sulfate ion that remains after washing reacts with high-energy exposure light to be precipitated as ammonium sulfide, and this causes haze on the photomask. Recently, the exposure light to be used has been changed from a KrF excimer laser light (wavelength: 248 nm) to an ArF excimer laser light (wavelength: 193 nm). Due to such shortening of the wavelength, energy of the exposure light has been increased. As a result, generation of haze on the photomask due to washing with an acid such as sulfuric acid has been becoming a significant problem.

In order to prevent such haze caused by washing with an acid, recently, it has began to employ ozone wash using ozone water, UV ozone or the like at the time of production of a photomask blank or after pattern formation.

However, ozone wash dissolves or deteriorates a light-shielding film, and this may change optical properties (reflectance, etc.) of the light-shielding film or an antireflection film.
[Patent Document 1] Japanese Laid-Open Patent Publication No. 2003-248298

DISCLOSURE OF THE INVENTION

Problems to be Solved by the Invention

Under the above-described circumstances, for example, a photomask blank and a photomask, in which optical properties (reflectance, etc.) and the width of pattern lines are not easily changed by ozone wash, are desired.

Means for Solving the Problems

The present inventors found that the atom number density of the light-shielding film depends on the change of the optical properties of the light-shielding film due to ozone wash, and based on this finding, achieved the present invention. The present invention provides photomask blanks, photomasks, etc. as described below.

[1] A photomask blank having a light-shielding film on a light transmissive substrate, wherein the atom number density of the front-surface portion of the light-shielding film is $9 \times 10^{22}$ to $14 \times 10^{22}$ atms/cm$^3$.

As used herein, the "front-surface portion" means a portion which is within 30 nm (preferably within 5 nm) from the front surface of the light-shielding film.

[2] The photomask blank according to item [1], wherein the light-shielding film consists of a plurality of layers.

[3] The phototmask blank according to item [2], wherein the thickness of a front-surface layer, which is provided to be closest to the front surface among the plurality of layers, is 3 to 30 nm.

Further, the surface roughness Ra of the front-surface layer is preferably 0.5 nm or less.

[4] The phototmask blank according to item [3], wherein the front-surface layer is made of CrO, CrON, CrOC, CrN or CrOCN.

[5] The photomask blank according to any one of items [1] to [4], wherein the atom number density of the front-surface portion is $10 \times 10^{22}$ to $13 \times 10^{22}$ atms/cm$^3$.

[6] The phototmask blank according to any one of items [1] to [5], wherein the front-surface portion of the light-shielding film has an amorphous structure in which the grain size is 2 nm or less.

[7] The photomask blank according to any one of items [2] to [6], wherein:
the light-shielding film comprises the front-surface layer and a light-shielding layer; and
the light-shielding layer is made of CrO, CrON, CrC, CrCN, CrOC, CrN or CrOCN.

[8] The photomask blank according to any one of items [2] to [6], wherein:
the light-shielding film comprises the front-surface layer and a light-shielding layer;
in the front-surface layer, the Cr content is 50% or less, the atom number ratio between O and Cr (O/Cr) is 0.5 or more, the atom number ratio between C and Cr (C/Cr) is 0.1 or more, and the atom number ratio between N and Cr (N/Cr) is 0.3 or more; and
in the light-shielding layer, the Cr content is 50% or more.

[9] The photomask blank according to any one of items [2] to [6], wherein:
the light-shielding film comprises the front-surface layer and a light-shielding layer; and
the light-shielding layer comprises a transition metal and Si.

[10] The photomask blank according to any one of items [2] to [6], wherein:
the light-shielding film comprises the front-surface layer and a light-shielding layer; and
the light-shielding layer comprises Ta.

[11] The photomask blank according to any one of items [1] to [10], wherein a phase shifter film is further provided between the light transmissive substrate and the light-shielding film.

[12] The photomask blank according to any one of items [1] to [11], which is used for a photomask that is subjected to ozone treatment.

[13] A photomask obtained by pattern formation using the photomask blank according to any one of items [1] to [12] according to a lithography method.

Advantageous Effect of the Invention

Regarding the light-shielding film of the photomask blank and the photomask according to a preferred embodiment of the present invention, the optical properties (reflectance, etc.) thereof are not easily changed by ozone wash at the time of production or use of the photomask. Regarding the light-shielding film of the photomask blank and the photomask according to a preferred embodiment of the present invention, the film thickness is not easily decreased by ozone wash at the time of production or use of the photomask. In addition, the antireflection layer of the photomask blank and the photomask according to a preferred embodiment of the present invention has a high chemical resistance to ozone.

EXPLANATIONS OF LETTERS OR NUMERALS

| | |
|---|---|
| 1 | front-surface layer |
| 2 | light-shielding layer |
| 3 | back-surface antireflection layer |
| 4 | front-surface antireflection layer |
| 5 | phase shifter film |
| 10 | light transmissive substrate |

BEST MODE FOR CARRYING OUT THE INVENTION

1. Photomask Blank

In the photomask blank of the present invention, the light-shielding film may be directly provided on the light transmissive substrate. Alternatively, other films such as a phase shifter film may be provided between the light-shielding film and the light transmissive substrate. Further, the photomask blank of the present invention includes a photomask blank in which a resist film is formed and a photomask blank in which a resist film is not formed.

1.1. Light Transmissive Substrate

The light transmissive substrate is not particularly limited as long as it is a substrate that is light-transmissive. Examples thereof include a quartz glass substrate, an aluminosilicate glass substrate, a calcium fluoride substrate, and a magnesium fluoride substrate. Among them, the quartz glass substrate is preferred, because it has a high flatness level and a high smoothness level, and because, when transferring a pattern to a semiconductor substrate using a photomask, distortion of a transfer pattern does not easily occur and it is possible to perform pattern transfer with high accuracy.

1.2. Light-Shielding Film

The light-shielding film of the photomask blank of the present invention may have a multilayer structure consisting of a plurality of layers or a single-layer structure consisting of one layer.

1.2.1. Light-Shielding Film Having Multilayer Structure

Figure 1:
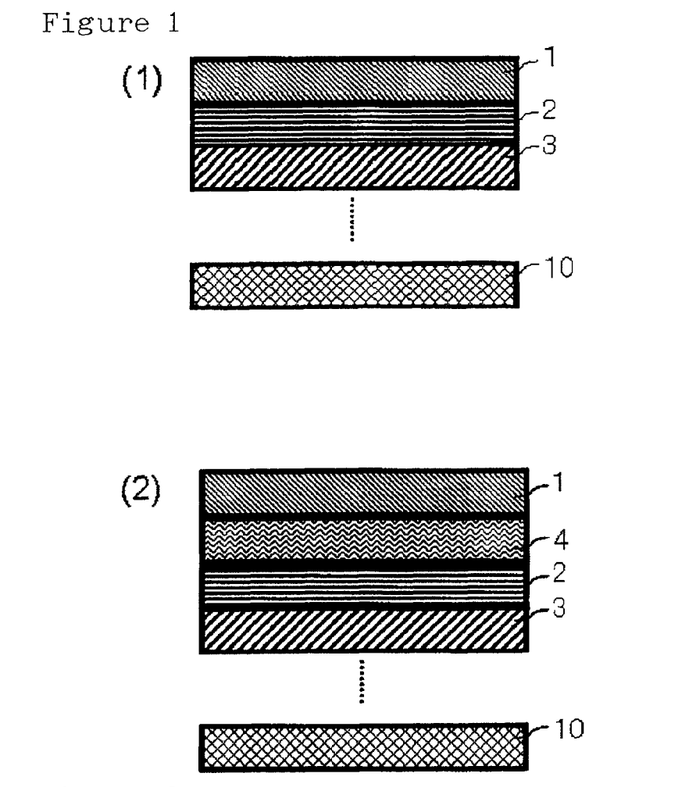
FIG. 1 shows diagrams of photomask blanks having a light-shielding film which has a multilayer structure.

Examples of photomask blanks having a light-shielding film with a multilayer structure include those in which the light-shielding film is constituted by 3 layers as shown in FIG. 1(1). In this specification, when the light-shielding film consists of 3 layers, the layers are called "front-surface layer 1", "light-shielding layer 2" and "back-surface antireflection layer 3" in this order from the side closest to the front surface in the light-shielding film. In this regard, in the case of the photomask blank in which the light-shielding film consists of 3 layers as shown in FIG. 1, it is preferred that the front-surface layer 1 also has the function of antireflection.

As shown in FIG. 1(2), it is also possible to provide a photomask blank of another embodiment in which a light-shielding film consists of 4 layers, which are a front-surface layer 1, a front-surface antireflection layer 2, a light-shielding layer 3 and a back-surface antireflection layer 4 in this order from the side closest to the front surface.

In this case, the front-surface layer 1 may have the function of etching mask. For example, in the case where the front-surface antireflection layer 2, the light-shielding layer 3 and the back-surface antireflection layer 4 are made of a Cr-based material, the front-surface layer 1 is preferably an etching mask layer comprising a Si-based material which is resistant to chlorine-based etching. Further, in the case where the front-surface antireflection layer 2, the light-shielding layer 3 and the back-surface antireflection layer 4 comprise a Si-based material, the front-surface layer 1 is preferably an etching mask layer made of a Cr-based material which is resistant to fluorine-based etching.

Further, in FIG. 1 (1) and (2), it is possible to employ a structure in which no back-surface antireflection layer 3 is provided.

(1) Front-Surface Layer

Among layers forming the light-shielding film, the front-surface layer of the present invention is a layer provided to the side farthest from the light transmissive substrate (front surface side), and is preferably a layer having ozone resistance.

Regarding the front-surface layer, the composition and the atom number density thereof are preferably homogeneous. Therefore, the atom number density of the front-surface layer including the front-surface portion of the light-shielding film (the portion which is within 30 nm, and preferably 5 nm from the front surface of the light-shielding film) is preferably 9 to $14 \times 10^{22}$ atms/cm$^3$, and more preferably 10 to $13 \times 10^{22}$ atms/cm$^3$. When such an atom number density is provided, change of optical properties in ozone wash of a photomask or photomask blank can be suppressed.

When the atom number density is less than $9 \times 10^{22}$ atms/$cm^3$, the amount of change of optical properties due to ozone wash tends to be increased. On the other hand, when the atom number density is more than $14 \times 10^{22}$ atms/$cm^3$, it is undesirable because it becomes difficult to control film-forming conditions.

The composition of the front-surface layer comprises: at least one selected from the group consisting of O, C and N; and a metal.

When the front-surface layer comprises Cr, the front-surface layer is preferably made of CrO (chromium oxide), CrON (chromium oxide nitride), CrOC (chromium oxide carbide), CrN (chromium nitride) or CrOCN (chromium oxide nitride carbide).

When the front-surface layer comprises O, the transmittance thereof tends to be higher. For this reason, the antireflection function is improved. Further, when the antireflection function of the front-surface layer is improved, the reflectance with respect to an exposure wavelength can be decreased. In addition, when a mask pattern is transferred to a transferred body, it is possible to suppress multiple reflection between the body and a projection exposure surface, and reduction of imaging characteristics can also be suppressed.

The front-surface layer is preferably made of a film of a Cr-based compound with the Cr content of 50% or less (in particular, CrOCN or CrOC), wherein the atom number ratio between O and Cr (O/Cr) is 0.5 or more, the atom number ratio between C and Cr (C/Cr) is 0.1 or more, and the atom number ratio between N and Cr (N/Cr) is 0.3 or more.

In the case where the atom number ratio O/Cr is less than 0.5, the atom number ratio C/Cr is less than 0.1 and the atom number ratio N/Cr is less than 0.3, it becomes difficult to control the etching rate, optical density and conductive property with the antireflection function being retained.

Further, the thickness of the front-surface layer depends on the composition thereof, etc., but is preferably 3 to 30 nm, and more preferably 10 to 20 nm. When the thickness is less than 3 nm, it is difficult to form a homogeneous film, and therefore, there is a possibility of reduction of ozone resistance. When the thickness is more than 30 nm, since it is too thick, it becomes difficult to reduce the thickness of a resist, and there is a possibility that it may be impossible to respond to miniaturization of a mask pattern.

Further, when the front-surface layer comprises Mo, the front-surface layer is preferably a layer made of MoSi, MoSiO, MoSiN or MoSiON. Moreover, such a layer may comprise C or H.

Furthermore, the front-surface layer may be a layer made of $SiO_2$ or SiON.

The front-surface layer preferably has an amorphous structure in which the grain size is 2 nm or less. The amorphous structure tends to be easily formed when a film is formed under a low pressure. For example, when the gas pressure during discharge by DC sputtering is 0.2 Pa or less, a front-surface layer in which the grain size is 2 nm or less can be formed.

Further, the front-surface layer is preferably an etching mask layer. That is because, since the etching mask layer has an amorphous structure, the etching rate of the etching mask layer can be increased, and in addition, etching time of the etching mask layer can be reduced.

For example, the case of using a photomask blank in which a light-shielding film consisting of a back-surface antireflection layer, a light-shielding layer and a front-surface antireflection layer, which is made of a MoSi-based material, and an etching mask layer made of a Cr-based material are provided in this order on a substrate will be described below. In this case, when using the Cr-based etching mask layer having a small thickness, load on a resist is reduced. As a result, reduction of the resolution at the time of transferring a mask pattern to the Cr-based etching mask layer is improved.

By employing this constitution, the thickness of a resist film can be reduced. However, when the thickness of the resist film is 150 nm or less, and moreover, 100 nm or less, the pattern shape is deteriorated, and LER (Line Edge Roughness) at the time when a mask pattern is transferred to the etching mask layer may be deteriorated. Therefore, etching time of the etching mask layer is preferably reduced.

Regarding the front-surface layer, the reflectance with respect to an exposure wavelength is preferably 25% or less, because in this case, influence of standing wave at the time of use of a photomask is effectively reduced.

Further, in the front-surface layer, it is desired that the in-plane distribution and the distribution among substrates of the reflectance with respect to a wavelength to be used for a defect inspection of a photomask blank or photomask (e.g., 198 nm, 257 nm, 364 nm, and 488 nm) are 2% or less because in this case, defects can be detected with high accuracy.

(2) Front-Surface Antireflection Layer

The front-surface antireflection layer of the present invention is a layer which is optionally provided between the front-surface layer and the light-shielding layer among layers forming the light-shielding film, and is a layer which mainly has the antireflection function.

The composition of the front-surface antireflection layer comprises: at least one selected from the group consisting of O, C and N; and a metal.

When the front-surface antireflection layer comprises Cr, the front-surface antireflection layer is preferably made of CrO (chromium oxide), CrON (chromium oxide nitride), CrOC (chromium oxide carbide), CrN (chromium nitride) or CrOCN (chromium oxide nitride carbide).

The front-surface antireflection layer is preferably made of a film of a Cr-based compound with the Cr content of 50% or less (in particular, CrOCN or CrOC), wherein the atom number ratio between O and Cr (O/Cr) is 0.5 or more, the atom number ratio between C and Cr (C/Cr) is 0.1 or more, and the atom number ratio between N and Cr (N/Cr) is 0.3 or more.

Further, when the front-surface antireflection layer comprises Mo, the front-surface antireflection layer is preferably a layer made of MoSi, MoSiO, MoSiN or MoSiON. Further, such a layer may comprise C or H.

Moreover, the front-surface antireflection layer may be made of $SiO_2$ or SiON.

Regarding the front-surface antireflection layer, the reflectance with respect to an exposure wavelength is preferably 25% or less, because in this case, influence of standing wave at the time of use of a photomask is effectively reduced.

Further, in the front-surface antireflection layer, it is desired that the in-plane distribution and the distribution among substrates of the reflectance with respect to a wavelength to be used for a defect inspection of a photomask blank or photomask (e.g., 198 nm, 257 nm, 364 nm, and 488 nm) are 2% or less because in this case, defects can be detected with high accuracy.

(3) Light-Shielding Layer

The light-shielding layer of the present invention is a layer provided to the downside of the front-surface layer, or the front-surface antireflection layer that is optionally provided, among layers forming the light-shielding film. The light-shielding layer constituting the light-shielding film has the highest light-shielding property among those of a plurality of layers in the film. The light-shielding layer preferably comprises: at least one selected from the group consisting of O, C and N; and a metal. The metal contained in the light-shielding layer is preferably a transition metal, and among transition metals, Cr, Mo or Ta is preferred.

When the light-shielding layer comprises Cr, the light-shielding layer is preferably made of CrO (chromium oxide), CrON (chromium oxide nitride), CrOC (chromium oxide carbide), CrC (chromium carbide), CrCN (chromium carbide nitride), CrN (chromium nitride) or CrOCN (chromium oxide nitride carbide).

Further, the light-shielding layer is preferably made of a Cr-based metal film (in particular, CrN or CrON) having the Cr content of 50% or more. In this case, the antireflection function of the front-surface layer can be easily provided utilizing reflection by the light-shielding layer and interference of reflection by the front-surface layer.

When the light-shielding layer constituting the light-shielding film of the photomask blank of the present invention comprises Mo, the light-shielding layer is preferably a layer of MoSi, MoSiO, MoSiN or MoSiON. Moreover, such a layer may comprise C or H.

The light-shielding layer constituting the light-shielding film of the photomask blank of the present invention may be a light-shielding layer comprising Ta.

(4) Back-Surface Antireflection Layer

Among layers forming the light-shielding film, the back-surface antireflection layer of the present invention is a layer provided to the downside of the light-shielding layer. The composition of the antireflection layer comprises: at least one selected from the group consisting of O, C and N; and a metal.

When the antireflection layer comprises Cr, the antireflection layer is preferably made of CrO, CrON, CrOC or CrOCN. The antireflection layer preferably comprises O, since the antireflection function is enhanced thereby.

Further, in the case of a three-layer structure, it is preferred that the antireflection layer and the front-surface layer have the same composition. In this case, the same type of gas is used for film forming, and it is only necessary to change gas conditions for the antireflection layer from those for the front-surface layer. As a result, the film-forming process becomes easier.

Regarding the antireflection layer, it is preferred that: the composition thereof consists of CrOCN or CrOC; the atom number ratio between O and Cr (O/Cr) is 0.5 or more; the atom number ratio between C and Cr (C/Cr) is 0.1 or more; and the atom number ratio between N and Cr (N/Cr) is 0.1 or more. The preferred thickness of the antireflection layer depends on the composition thereof, etc., but the thickness is usually about 5 to 30 nm, and preferably 10 to 20 nm.

Further, when the back-surface reflectance is too low at a wavelength that is within a range of from about 600 nm to 800 nm, there is a case where it cannot be recognized by a substrate recognition sensor or the like. Therefore, it is preferred to adjust to maintain the reflectance of 5% or more.

In items (1) to (4) above, when the front-surface layer, the front-surface antireflection layer or the back-surface antireflection layer is made of CrOCN, it is preferred to employ an embodiment in which a Cr—Cr binding component and a $CrO_xN_y$ component are mixed together. Further, when the light-shielding layer is made of CrN, it is preferred to employ an embodiment in which a Cr—Cr binding component is the main component and a $CrO_xN_y$ component is in a small amount. By providing a larger amount of the $CrO_xN_y$ component, the etching rate can be accelerated.

Further, when the front-surface layer, the front-surface antireflection layer or the back-surface antireflection layer is made of CrOCN, regarding carbon, it is preferred to provide a state in which chromium carbide (Cr—C) is the main component and other components, C—C, C—O and C—N are mixed therewith.

1.2.2. Light-Shielding Film Having a Single-Layer Structure

Regarding a photomask blank having a light-shielding film having a single-layer structure, the entire light-shielding film may have a homogeneous composition. However, it is preferred to provide a structure in which the composition changes in the depth direction of the light-shielding film.

Further, in the present invention, the front-surface portion of the light-shielding film means a portion which is within 30 nm (preferably within 5 nm) from the front surface of the light-shielding film, and also in the case of the light-shielding film having the single-layer structure, the atom number density of the front-surface portion thereof is $9 \times 10^{22}$ to $14 \times 10^{22}$ atms/cm$^3$, and preferably $10 \times 10^{22}$ to $13 \times 10^{22}$ atms/cm$^3$. By providing such an atom number density, it is possible to prevent decrease of the film thickness due to ozone water, and to suppress change of optical properties at the time of ozone wash of a photomask or photomask blank.

1.3. Phase Shifter Film

In the photomask blank of the present invention, a phase shifter film may be provided between the light-shielding film and the light transmissive substrate.

The phase shifter film is a film having the function to shift the phase of an exposure light and the function to transmit 2 to 40% of the exposure light. In the photomask blank of the present invention, a publicly-known phase shifter film can be used.

Thus, in the photomask blank of the present invention, by providing the phase shifter film between the light-shielding film and the light transmissive substrate, a halftone phase shift mask blank can be provided.

2. Method for Producing Photomask Blank

The photomask blank of the present invention can be obtained, for example, by forming a light-shielding film, a phase shifter film that is optionally provided, etc. on a light transmissive substrate utilizing reactive sputtering.

In a sputtering method, a direct-current (DC) power source or a high-frequency (RF) power source may be used. Further, a magnetron sputtering method or a conventional method may be employed.

Further, as a film-forming apparatus, an in-line type apparatus or a single-wafer type apparatus may be used. However, in order to form a light-shielding layer having a high atom number density, a single-wafer type film-forming apparatus is preferably used.

When forming a front-surface layer, a light-shielding layer or antireflection layers (a front-surface antireflection layer and a back-surface antireflection layer) which contain Cr, chromium is used as a target. In addition, the composition of a sputtering gas is prepared according to the composition of the layer(s) other than Cr.

Specifically, when forming a front-surface layer, a light-shielding layer or antireflection layers which are made of CrOC by reactive sputtering, as a sputtering gas, at least one C-containing gas such as $CH_4$, $CO_2$ and CO and at least one O-containing gas such as $CO_2$ and $O_2$ are introduced. Moreover, an inert gas such as Ar and He can be added thereto. Such gases may be separately introduced into a chamber or mixed together in advance for introduction.

Further, as a sputtering gas, $CO_2$ or a mixed gas of $CO_2$ and an inert gas is preferably used, since the atom number density of a CrCO film formed is improved thereby.

When forming a front-surface layer, a light-shielding layer or antireflection layers which are made of CrOCN by reactive sputtering, as a sputtering gas, at least one C-containing gas such as $CH_4$, $CO_2$ and CO, at least one O-containing gas such as $CO_2$ and $O_2$ and at least one N-containing gas such as $N_2$, NO and $N_2O$ are introduced. Moreover, an inert gas such as Ar and He can be added thereto. Such gases may be separately introduced into a chamber or mixed together in advance for introduction.

Further, as a sputtering gas, a mixed gas of $CO_2$ and $N_2$ or a mixed gas of $CO_2$, $N_2$ and an inert gas is preferably used, because it is safe and because, since reactivity of $CO_2$ gas is lower than that of $O_2$, etc., the gas can be homogeneously diffused in a wide area of the chamber and as a result, a CrCON film formed is homogeneous.

When forming a light-shielding layer made of CrN by reactive sputtering, as a sputtering gas, an N-containing gas such as $N_2$ is introduced. Moreover, an inert gas such as Ar and He can be added thereto. Such gases may be separately introduced into a chamber or mixed together in advance for introduction.

When forming a front-surface layer, a light-shielding layer or antireflection layers which are made of CrON by reactive sputtering, as a sputtering gas, at least one O-containing gas such as NO and $O_2$ and at least one N-containing gas such as $N_2$, NO and $N_2O$ are introduced. Moreover, an inert gas such as Ar and He can be added thereto. Such gases may be separately introduced into a chamber or mixed together in advance for introduction.

When forming a front-surface layer, a light-shielding layer or antireflection layers which are made of CrOC by reactive sputtering, as a sputtering gas, at least one C-containing gas such as $CH_4$, $CO_2$ and CO and at least one O-containing gas such as $CO_2$ and $O_2$ are introduced. Moreover, an inert gas such as Ar and He can be added thereto. Such gases may be separately introduced into a chamber or mixed together in advance for introduction.

When forming a front-surface layer, a light-shielding layer or antireflection layers which are made of CrO by reactive sputtering, as a sputtering gas, an O-containing gas such as $O_2$ is introduced. Moreover, an inert gas such as Ar and He can be added thereto. Such gases may be separately introduced into a chamber or mixed together in advance for introduction.

When forming a light-shielding layer containing Mo and Si, a target containing Mo and Si may be used. Alternatively, both a target of Mo and a target of Si may be used. By adjusting the sputtering area of the target and the power applied to the target, the composition ratio between Mo and Si in the light-shielding layer is adjusted. Further, in the light-shielding layer, in addition to Mo and Si, when C is to be contained, a C-containing gas such as $CH_4$, $CO_2$ and CO can be used as a sputtering gas. Similarly, when N is to be contained, an N-containing gas such as $N_2$, NO and $N_2O$ can be used as a sputtering gas, and when O is to be contained, an O-containing gas such as $CO_2$ and $O_2$ can be used as a sputtering gas.

When forming a light-shielding layer containing Ta, as in the case of forming the light-shielding layer containing Mo and Si, a target containing Ta is used. Moreover, when C, O, N or the like is to be contained in a light-shielding layer in addition to Ta, a sputtering gas to be used is the same as that for forming the light-shielding layer containing Mo and Si.

3. Photomask and Production Method Thereof

A photomask obtained from the photomask blank of the present invention and a method for producing the same will be described below.

Firstly, a resist is applied to a photomask blank in which a light-shielding film is formed, and it is dried to obtain a resist film. It is required to select an appropriate resist corresponding to a writing apparatus to be used. For EB writing that is usually employed, a positive-type or negative-type resist having an aromatic skeleton in a polymer is preferably used, and for production of a photomask for a fine pattern in which the present invention is particularly effectively used, a chemically-amplified resist is preferably used.

The thickness of the resist film must be within a range in which a good pattern shape can be obtained and the film can function as an etching mask. In particular, when forming a fine pattern as a mask for ArF exposure, the film thickness is preferably 200 nm or less, and more preferably 150 nm or less. Note that when utilizing a two-layer resist method in which a resist comprising a silicon-based resin is combined with a lower layer comprising an aromatic resin, or a surface imaging method in which a chemically-amplified aromatic resist is combined with a silicon-based surface treatment agent, the film thickness can be further reduced. Application conditions and a drying method are suitably selected depending on the type of a resist to be used.

In order to reduce occurrence of stripping or collapsing of a fine resist pattern, a resin layer may be formed on the surface of a photomask blank before application of a resist. Further, instead of forming the resin layer, a surface treatment for decreasing surface energy on the surface of the substrate (photomask blank) may be performed before application of the resist. Examples of surface treatment methods include those in which HMDS or another organosilicon-based surface treatment agent that is commonly used in the semiconductor production processes is used to alkylsilylate the surface.

Next, regarding the photomask blank in which the resist film is formed, writing to the resist can be carried out using a method utilizing EB irradiation or a method utilizing light irradiation. In general, the method utilizing EB irradiation is preferably used to form a fine pattern. When using a chemically-amplified resist, writing is usually carried out with energy in a range of 3 to 40 $\mu C/cm^2$, and after writing, heat treatment is applied thereto and then a resist film is subjected to development treatment to obtain a resist pattern.

Using the resist pattern obtained above as an etching mask, etching is applied to a light-shielding film or a light-shielding film and other films (phase shifter film, etc.). At the time of etching, a publicly-known chlorine-based or fluorine-based dry etching can be suitably used depending on the composition of the light-shielding film (surface layer, light-shielding layer, antireflection layer, etc.) or other films.

After obtaining a light-shielding pattern by etching, the resist is stripped using a predetermined stripping solution, thereby obtaining a photomask in which the light-shielding film pattern is formed.

4. Pattern Transfer

The photomask of the present invention is especially useful as a mask to be used in a pattern transfer method in which a fine pattern with a DRAM half-pitch (hp) of 45 nm or less in a semiconductor design rule is formed by using an exposure method with a numerical aperture NA>1 and an exposure light wavelength of equal to or less than 200 nm.

The photomask blank of the present invention is especially effective in a case where it is used for forming a resist pattern with a line width of less than 100 nm on a photomask blank. A mask having an OPC structure is an example of such a photomask blank. In the OPC mask, the width of an auxiliary pattern provided around the main pattern with the object of increasing the resolution of the main pattern is the smallest. Therefore, the photomask blank of the present invention is especially useful for pattern transfer using a photomask having these patterns.

EXAMPLES

Hereinafter, the present invention will be described in more detail based on working examples and a comparative example, but the present invention is not limited to the working examples.

Example 1

Figure 2:
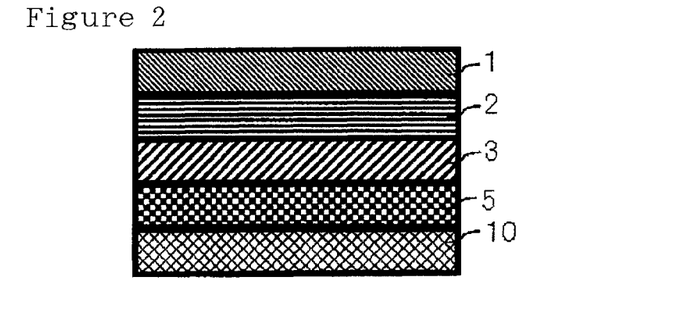
FIG. 2 shows a diagram of a photomask blank produced in Example 1.

In this working example, a halftone phase shift mask blank, in which a phase shifter film 5 and a light-shielding film consisting of 3 layers are provided on a light transmissive substrate 10, was produced (see FIG. 2).

Firstly, on the light transmissive substrate 10 made of quartz glass having a size of 6-inch square and a thickness of 0.25 inch, a halftone phase shifter film 5 for ArF excimer laser (wavelength: 193 nm) constituted by a single layer comprising Mo, Si and N as the main components was formed (thickness: 69 nm) using a single-wafer sputtering apparatus.

As shown in Table 1, sputtering (DC sputtering) conditions are as follows:
Sputtering target: a mixed target of Mo and Si (Mo:Si=8:92 mol %)
Sputtering gas: a mixed gas atmosphere of Ar gas, $N_2$ gas and He gas (Ar: 9 sccm, $N_2$: 81 sccm, He: 76 sccm)
Gas pressure during discharge: 0.3 Pa
Applied power: 2.8 kW When the ArF excimer laser light (wavelength: 193 nm) was applied, the transmittance of the obtained phase shifter film 5 was 5.5% and the phase shift amount was about 180°.

Next, using the same sputtering apparatus as that by which the phase shifter film 5 was formed, a back-surface antireflection layer 3 made of CrOCN was formed (thickness: 30 nm). Sputtering (DC sputtering) conditions are shown in Table 1.

After that, using the same sputtering apparatus as that by which the back-surface antireflection layer 3 was formed, a light-shielding layer 2 made of CrN was formed (thickness: 4 nm). Sputtering (DC sputtering) conditions are shown in Table 1.

In addition, using the same sputtering apparatus as that by which the light-shielding layer 2 was formed, a front-surface layer 1 made of CrOCN was formed (thickness: 14 nm). Sputtering (DC sputtering) conditions are shown in Table 1.

Thus, a photomask blank, in which the phase shifter film 5, the back-surface antireflection layer 3, the light-shielding layer 2 and the front-surface layer 1 are laminated in this order on the light transmissive substrate made of quartz glass, was obtained. The optical density (O.D.) of the light-shielding film consisting of the back-surface antireflection layer 3, the light-shielding layer 2 and the front-surface layer 1 with respect to light having a wavelength of 193.4 nm was 1.9.

Further, compositions and atom number densities of the front-surface layer 1 and the back-surface antireflection layer 3 of the obtained photomask blank were analyzed by RBS (Rutherford Backscattering Spectrometry). RBS is a technique for analyzing a surface composition relative to a surface density (atms/cm$^2$) in the depth direction. When the thickness of each layer is already-known, the atom number densities (atms/cm$^3$) can be calculated from the following formula:

Atom Number Density=Surface Density/Thickness

The atom number density of the front-surface layer 1 was calculated using the above-described technique.

As a result, the film composition of the front-surface layer 1 (thickness: 14 nm) was as follows: Cr: 34 atomic %, C: 11 atomic %, O: 39 atomic %, and N: 16 atomic %. Further, the chromium ratio in the front-surface layer 1 was as follows: C/Cr: 0.3, O/Cr: 1.2, and N/Cr: 0.5. Further, the atom number density of the front-surface layer 1 was $10.5 \times 10^{22}$ atms/cm$^3$.

Regarding the film composition of the light-shielding layer 2 (thickness: 4 nm), Cr was at least 64 atomic % or more, and N was at least 8 atomic % or more.

Further, the film composition of the back-surface antireflection layer 3 (thickness: 30 nm) was as follows: Cr: 36 atomic %, C: 15 atomic %, O: 39 atomic %, and N: 9 atomic %. Further, the chromium ratio in the back-surface antireflection layer 3 was as follows: C/Cr: 0.4, O/Cr: 1.1, and N/Cr: 0.3.

When the cross section of the obtained photomask blank was observed using a TEM (transmission electron microscope) and an X-ray diffractometer (XRD), the front-surface layer 1 had an amorphous structure in which the grain size was 1 to 2 nm. When measuring the surface roughness using an atomic force microscope (AFM), Ra=0.45 nm.

Next, ozone water having a concentration of 50 ppm was supplied with a flow rate of 1.4 L/minute to the surface of the substrate of the photomask blank obtained in this working example being shaken by a swing arm for 60 minutes to bring the light-shielding film into contact with ozone water, and changes of the thickness, surface reflectance and optical density of the light-shielding film were measured to evaluate chemical resistance.

As a result, the thickness of the light-shielding film was not changed by spraying of the ozone water. Further, change of the surface reflectance was +0.82% when using light having a wavelength of 193 nm. Change of the optical density of the light-shielding film was −0.04.

In addition, the same layer as the front-surface layer 1 of this working example was directly formed on a glass substrate by sputtering, and ozone water having a concentration of 50 ppm was sprayed on the front-surface layer 1 for 60 minutes to bring the light-shielding film into contact with ozone water, thereby measuring change of the reflectance. Note that in the measurement of this working example, using a spectrophotometer (Hitachi High-Technologies Corporation; U-4100), a reflection spectrum was measured before and after contact with the ozone water.

As a result, changes were as follows: light having a wavelength of 193 nm: +0.7% (23.6%→>24.3%), light having a wavelength of 257 nm: +1.5% (20.7%→22.2%), light having a wavelength of 365 nm: +2.0% (29.5%→31.5%), and light having a wavelength of 488 nm: +1.2% (39.5%→40.7%). As used herein, "+" represents increase of reflectance, and "−" represents decrease of reflectance.

Thus, it was confirmed that the light-shielding film of this working example has high chemical resistance with respect to ozone treatment.

Example 2

Figure 3:
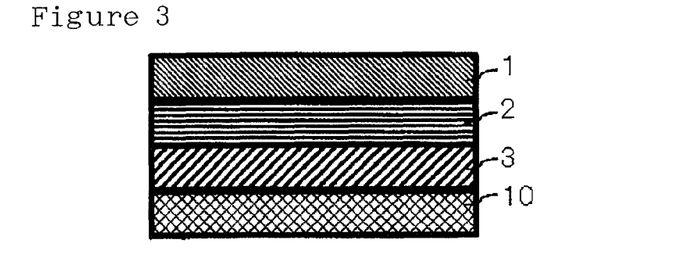
FIG. 3 shows a diagram of a photomask blank produced in Example 2.

In this working example, a binary mask blank, in which a light-shielding film consisting of 3 layers is provided on a light transmissive substrate 10, was produced (see FIG. 3).

That is, reactive sputtering was carried out under the same conditions as those in Example 1 except that the conditions of sputtering were set as shown in Table 1.

Thus, a photomask blank as shown in FIG. 3, in which the back-surface antireflection layer 3, the light-shielding layer 2 and the front-surface layer 1 are laminated in this order on the light transmissive substrate 10 made of quartz glass, was obtained. The optical density (O.D.) of the light-shielding film consisting of the back-surface antireflection layer 3, the light-shielding layer 2 and the front-surface layer 1 with respect to light having a wavelength of 193.4 nm was 3.

Next, in the same manner as that in Example 1, the compositions of the front-surface layer 1, the light-shielding layer 2 and the back-surface antireflection layer 3 obtained and the atom number density of the front-surface layer 1 were analyzed by RBS.

As a result, the film composition of the front-surface layer 1 (thickness: 14 nm) was as follows: Cr: 32 atomic %, C: 16 atomic %, O: 37 atomic %, and N: 16 atomic %. Further, the chromium ratio in the front-surface layer 1 was as follows: C/Cr: 0.5, O/Cr: 1.2, and N/Cr: 0.5. Further, the atom number density of the front-surface layer 1 was $11.0 \times 10^{22}$ atms/cm$^3$.

Regarding the film composition of the light-shielding layer 2 (thickness: 25 nm), Cr was 87 atomic %, O was 9 atomic % and N was 4 atomic %. Further, the chromium ratio in the light-shielding layer 2 was as follows: O/Cr: 0.1, and N/Cr: 0.05.

The film composition of the back-surface antireflection layer 3 (thickness: 25 nm) was as follows: Cr: 49 atomic %, C: 11 atomic %, O: 26 atomic %, and N: 14 atomic %. Further, the chromium ratio in the back-surface antireflection layer 3 was as follows: C/Cr: 0.2, O/Cr: 0.5, and N/Cr: 0.3.

When the cross section of the obtained photomask blank was observed using a TEM (transmission electron microscope) and an X-ray diffractometer (XRD), the front-surface layer 1 had an amorphous structure in which the grain size was 1 to 2 nm. When measuring the surface roughness using an atomic force microscope (AFM), Ra=0.28 nm.

Further, ozone water having a concentration of 50 ppm was supplied with a flow rate of 1.4 L/minute to the surface of the substrate of the photomask blank obtained in this working example being shaken by a swing arm for 60 minutes to bring the light-shielding film into contact with ozone water, and changes of the thickness, surface reflectance and optical density of the light-shielding film were measured to evaluate chemical resistance.

As a result, the thickness of the light-shielding film was not changed by spraying of the ozone water. Further, change of the surface reflectance was −0.02% when using light having a wavelength of 193 nm. Change of the optical density of the light-shielding film was −0.06.

In addition, the same layer as the front-surface layer 1 of this working example was directly formed on a glass substrate by sputtering, and ozone water having a concentration of 50 ppm was sprayed on the front-surface layer 1 for 60 minutes to bring the light-shielding film into contact with ozone water, thereby measuring change of the reflectance in the same measurement method as that in Example 1.

As a result, changes were as follows: light having a wavelength of 193 nm: +0.5% (18.8%→19.3%), light having a wavelength of 257 nm: +2.1% (14.0%→16.1%), light having a wavelength of 365 nm: +5.3% (22.4%→27.7%), and light having a wavelength of 488 nm: +4.6% (38.47%→43.03%).

Thus, it was confirmed that the light-shielding film of this working example has high chemical resistance with respect to ozone treatment.

Comparative Example 1

In this comparative example, a halftone phase shift mask blank, which has a light-shielding film consisting of 2 layers, was produced.

Specifically, using an in-line sputtering apparatus, a light-shielding layer was formed on the same phase shifter film as that in Example 1. As shown in Table 1, sputtering (DC sputtering) conditions are as follows:
Sputtering target: Cr
Sputtering gas: a mixed gas atmosphere of Ar gas, N$_2$ gas and He gas (Ar: 30 sccm, N$_2$: 30 sccm, He: 40 sccm)
Gas pressure during discharge: 0.2 Pa
Applied power: 0.8 kW After that, a front-surface layer was formed on the light-shielding layer. As shown in Table 1, sputtering (DC sputtering) conditions are as follows:
Sputtering target: chromium (Cr)
Sputtering gas: a gas in which a mixed gas of argon (Ar) and methane (CH$_4$) (CH$_4$: 3.5 volume %), NO and He are mixed together (Ar+CH$_4$: 65 sccm, NO: 3 sccm, He: 40 sccm)
Gas pressure during discharge: 0.3 Pa
Applied power: 0.3 kW Thus, a photomask blank having a thickness of the light-shielding film of 48 nm, in which the phase shifter film, the light-shielding layer and the front-surface layer are laminated in this order on the light transmissive substrate made of quartz glass, was obtained. The optical density (OD) of the light-shielding film consisting of the light-shielding layer and the front-surface layer with respect to light having a wavelength of 193.4 nm was 1.9.

Next, in the same manner as that in Example 1, the composition and the atom number density of the obtained front-surface layer were analyzed by RBS.

As a result, the film composition of the front-surface layer (thickness: 24 nm) was as follows: Cr: 34 atomic %, O: 32 atomic % and N: 23 atomic %. Further, the chromium ratio in the front-surface layer was as follows: O/Cr: 0.9, and N/Cr: 0.7. Further, the atom number density of the front-surface layer was $7.4 \times 10^{22}$ atms/cm$^3$.

When the cross section of the obtained photomask blank was observed using a TEM (transmission electron microscope) and an X-ray diffractometer (XRD), the front-surface layer had a low-density porous columnar structure. When measuring the surface roughness using an atomic force microscope (AFM), Ra=0.70 nm.

In addition, chemical resistance of the photomask blank obtained in this comparative example was evaluated in a manner similar to that in Example 1.

As a result, the thickness of the light-shielding film was decreased by 5.8 nm by spraying of the ozone water. Further, change of the surface reflectance was +2.72% when using light having a wavelength of 193 nm. Change of the optical density of the light-shielding film was −0.38.

In addition, the same layer as the front-surface layer of this comparative example was directly formed on a glass substrate by sputtering, and ozone water having a concentration of 50 ppm was sprayed on the front-surface layer for 60 minutes to bring the light-shielding film into contact with ozone water, thereby measuring change of the amount of the reflectance using the same measurement method as that in Example 1.

As a result, changes were as follows: light having a wavelength of 193 nm: +2.5% (19.8%→22.3%), light having a wavelength of 257 nm: +9.1% (16.4%→25.5%), light having a wavelength of 365 nm: +13.9% (19.9%→33.8%), and light having a wavelength of 488 nm: +11.0% (29.9%→40.9%).

Thus, it was confirmed that the light-shielding film of this comparative example had lower chemical resistance with respect to ozone treatment compared to Examples 1 and 2.

TABLE 1

| | Film | | Sputtering gas (sccm) | | | | | | Gas Pressure (Pa) | Applied Power (kw) | Thickness (nm) |
|---|---|---|---|---|---|---|---|---|---|---|---|
| | Composition | Target | Ar | CH$_4$ | CO$_2$ | NO | N$_2$ | He | | | |
| Example 1 | Front-surface antireflection layer 1 | CrOCN | Cr | 20 | — | 35 | — | 10 | 30 | 0.2 | 1.7 | 14 |
| | Light-shielding layer 2 | CrN | Cr | 25 | — | — | — | 5 | — | 0.1 | 1.7 | 4 |
| | Back-surface antireflection layer 3 | CrOCN | Cr | 20 | — | 35 | — | 5 | 30 | 0.2 | 1.5 | 30 |
| | Phase shifter film 5 | MoSiN | Mo + Si | 9 | — | — | — | 81 | 76 | 0.3 | 2.8 | 69 |
| Example 2 | Front-surface antireflection layer 1 | CrOCN | Cr | 20 | — | 35 | — | 10 | 30 | 0.2 | 1.8 | 14 |
| | Light-shielding layer 2 | CrON | Cr | 20 | — | — | 15 | — | 30 | 0.1 | 1.7 | 25 |
| | Back-surface antireflection layer 3 | CrOCN | Cr | 20 | — | 25 | — | 10 | 30 | 0.2 | 1.7 | 25 |
| Comparative Example 1 | Front-surface layer 1 | CrON | Cr | Ar + CH$_4$ (3.5%) 65 | | — | 3 | — | 40 | 0.3 | 0.3 | 24 |
| | Light-shielding layer 2 | CrN | Cr | 30 | — | — | — | 30 | 40 | 0.2 | 0.8 | 24 |

INDUSTRIAL APPLICABILITY

Examples of practical uses of the present invention include microfabrication of photomasks, photomask blanks, and semiconductor integrated circuits, etc. using the same.

The invention claimed is:

1. A photomask blank having a light-shielding film on a light transmissive substrate,
wherein the atom number density of the front-surface portion of the light-shielding film is $9 \times 10^{22}$ to $14 \times 10^{22}$ atms/cm$^3$
wherein
the light-shielding film consists of a plurality of layers, and
wherein
the light-shielding film comprises the front-surface layer and a light-shielding layer; and the light-shielding layer is made of CrO, CrON, CrC, CrCN, CrOC, CrN or CrOCN.

2. The phototmask blank according to claim 1, wherein the thickness of a front-surface layer, which is provided to be closest to the front surface among the plurality of layers, is 3 to 30 nm.

3. The photomask blank according to claim 1, wherein the atom number density of the front-surface portion is $10 \times 10^{22}$ to $13 \times 10^{22}$ atms/cm$^3$.

4. The phototmask blank according to claim 1, wherein the front-surface portion of the light-shielding film has an amorphous structure in which the grain size is 2 nm or less.

5. The photomask blank according to claim 1, wherein:
the light-shielding film comprises the front-surface layer and a light-shielding layer; and
the light-shielding layer comprises a transition metal and Si.

6. The photomask blank according to claim 1, wherein:
the light-shielding film comprises the front-surface layer and a light-shielding layer; and
the light-shielding layer comprises Ta.

7. The photomask blank according to claim 1, wherein a phase shifter film is further provided between the light transmissive substrate and the light-shielding film.

8. The photomask blank according to claim 1, which is used for a photomask that is subjected to ozone treatment.

9. A photomask obtained by pattern formation using the photomask blank according to claim 1 according to a lithography method.

10. A photomask blank having a light-shielding film on a light transmissive substrate,
wherein the atom number density of the front-surface portion of the light-shielding film is $9 \times 10^{22}$ to $14 \times 10^{22}$ atms/cm$^3$,
wherein the light-shielding film consists of a plurality of layers, and
wherein the light-shielding film comprises the front-surface layer and a light-shielding layer; in the front-surface layer, the Cr content is 50% or less, the atom number ratio between O and Cr (O/Cr) is 0.5 or more, the atom number ratio between C and Cr (C/Cr) is 0.1 or more, and the atom number ratio between N and Cr (N/Cr) is 0.3 or more; and in the light-shielding layer, the Cr content is 50% or more.

11. The phototmask blank according to claim 10, wherein the thickness of a front-surface layer, which is provided to be closest to the front surface among the plurality of layers, is 3 to 30 nm.

12. The phototmask blank according to claim 10, wherein the atom number density of the front-surface portion is $10 \times 10^{22}$ to $13 \times 10^{22}$ atms/cm$^3$.

13. The phototmask blank according to claim 10, wherein the front-surface portion of the light-shielding film has an amorphous structure in which the grain size is 2 nm or less.

14. The photomask blank according to claim 10, wherein:
the light-shielding film comprises the front-surface layer and a light-shielding layer; and
the light-shielding layer comprises a transition metal and Si.

15. The photomask blank according to claim 10, wherein:
the light-shielding film comprises the front-surface layer and a light-shielding layer; and
the light-shielding layer comprises Ta.

16. The photomask blank according to claim 10, wherein a phase shifter film is further provided between the light transmissive substrate and the light-shielding film.

17. The photomask blank according to claim 10, which is used for a photomask that is subjected to ozone treatment.

18. A photomask obtained by pattern formation using the photomask blank according to claim 10 according to a lithography method.

19. A photomask blank having a light-shielding film on a light transmissive substrate, wherein the atom number density of the front-surface portion of the light-shielding film is $9 \times 10^{22}$ to $14 \times 10^{22}$ atms/cm$^3$ and,
wherein the front-surface portion is made of CrO, CrON, CrOC, CrN or CrOCN.

* * * * *